United States Patent [19]
Kamijo

[11] Patent Number: 5,589,278
[45] Date of Patent: Dec. 31, 1996

[54] MAGNETORESISTIVE THIN-FILM AND DEVICE

[75] Inventor: Atsushi Kamijo, Tokyo, Japan

[73] Assignee: NEC Corporation, Tokyo, Japan

[21] Appl. No.: 498,389

[22] Filed: Jul. 5, 1995

[30] Foreign Application Priority Data

Jul. 5, 1994 [JP] Japan .................. 6-1583188

[51] Int. Cl.$^6$ .................................. G11B 5/66
[52] U.S. Cl. .................. 428/611; 428/635; 428/662; 428/663; 428/665; 428/666; 428/681; 428/693; 428/900; 428/167; 428/928; 338/32 R; 360/113
[58] Field of Search ................... 428/611, 635, 428/662, 663, 665, 666, 681, 693, 900, 167, 928; 334/252; 338/32 R; 360/113

[56] References Cited

U.S. PATENT DOCUMENTS 5,341,118  8/1994  Parkin et al. .............. 338/32 R

FOREIGN PATENT DOCUMENTS 6-177453  6/1994  Japan .

OTHER PUBLICATIONS

Folkerts et al "Microstructure induced magnetic anisotropy in Fe/Cr (110) superlattices" J. Appl. Phys. 73 (8) 15 Apr. 1993 pp. 3922–3925.

Primary Examiner—Stevan A. Resan
Attorney, Agent, or Firm—Popham Haik Schnobrich & Kaufman, Ltd.

[57] ABSTRACT

Disclosed is a magnetoresistive thin-film, which a (110) oriented epitaxial buffer layer 2 made of a body-centered cubic crystalline metal or alloy is formed on a single crystalline substrate 1, thereon with layer a (110) oriented epitaxial Fe/Cr superlattice film on which Fe layers 3 and Cr layers 4 alternately are epitaxially grown, the Fe/Cr superlattice having a structure in which staircase facets which have ridge lines to the <100> direction at (110) surface and have {100} side surfaces stand side by side to the <110> direction. The dispersion of the widths of the staircase facets falls within ±50%. Also disclosed is a magnetoresistive device which is provided with the above magnetoresistive thin-film and a means for applying a magnetic field parallel to the ridge lines of the staircase facets to the thin-film.

8 Claims, 10 Drawing Sheets

MAGNETORESISTIVE THIN-FILM AND DEVICE

FIELD OF THE INVENTION

This invention relates to a magnetoresistive thin-film and a magnetoresistive device using the same, and more particularly to, a magnetoresistive thin film which is used for a magnetoresistive device such as a-magnetic sensor, a magnetic head and the like.

BACKGROUND OF THE INVENTION

A magnetoresistive device which utilizes magnetoresistance effect by which a resistance is varied by magnetic field applied is used for a sensor for detecting magnetic field, a magnetic head or the like. Conventionally, the magnetoresistive device employs a magnetic alloy thin film which is typically made of permalloy. Though the magnetoresistive device utilizes the difference of resistance which occurs depending on the relative angle between current direction and magnetization direction, the magnetoresistance ratio is as small as about 3 to 4%. Therefore, in order to increase sensibility, a material of large magnetoresistance ratio is desired.

Recently, as a new magnetoresistive element, a superlattice film made of with alternately layering a ferromagnetic material such as Fe, Co and a non-magnetic material such as Cr, Cu in a few nanometers period is known. The magnetoresistance effect by the superlattice film is established when the magnetization arrangement of the ferromagnetic layers which are separated by the non-magnetic layer changes from antiferromagnetic to ferromagnetic according to the increasing of the magnetic field applied, thereby obtaining the magnetoresistance ratio more than 10% at room temperature. It is called a giant magnetoresistance effect to distinguish from the conventional magnetoresistance effect. As the superlattice film showing the giant magnetoresistance effect, the films made of Fe/Cr, permalloy/Cu/Co/Cu, Co/Cu and the like are known. Since these superlattice films have a larger magnetoresistance ratio than the permalloy thin film which is conventionally known, they are expected to significantly improve the properties when they are applied to the magnetic sensor or head. However, in the superlattice films reported until now, they show a high value of the saturation magnetic field Hs of a few kOe to about 10 kOe which means saturation of magnetoresistance in comparison with that of permalloy of a few Oe. Therefore, it is difficult for them to apply to a magnetic sensor or head which requires sensibility of magnetic field.

On the other hand, inducing a uniaxial in-plane magnetic anisotropy to a superlattice film is suggested as a method for decreasing the saturation magnetic field of the superlattice film while maintaining the high magnetoresistance ratio thereof. For instance, Japanese Patent Application Laid-Open No. 4-212402 discloses a method for inducing a uniaxial in-plane magnetic anisotropy to a superlattice film where the magnetic field of about 100 Oe is applied to the film surface by a permanent magnet when Fe/Cr superlattice film is prepared. Furthermore, W. Folkerts and F. Hakkens, "Microstructure Induced Magnetic Anisotropy in Fe/Cr(110) Superlattices" J. Appl. Phys. vol.73, pp.3922–3924 (1993) describes a method for inducing a uniaxial in-plane -anisotropy to a superlattice film by the structural magnetic anisotropy which is caused by the microstructure provided with a Fe/Cr (110) superlattice film. As compared with the former method, the latter method in which the uniaxial magnetic anisotropy is induced with utilizing the structural magnetic anisotropy is more effective to decrease the saturation magnetic field. However, the level of the saturation magnetic field is still so high as 500 Oe at room temperature.

As described above, the Fe/Cr (110) superlattice which has the microstructure has a disadvantage that the level of the saturation magnetic field is too high whereas it has the large magnetoresistance ratio. Thus, when it is employed for a device such as a magnetic sensor or head in which a low magnetic field is detected, the device can not obtain enough sensibility.

SUMMARY OF THE INVENTION

Accordingly, it is an object of the invention to provide a magnetoresistive thin film which can obtain a large magnetoresistance ratio even at a low magnetic field and provide a low saturation magnetic field.

It is a further object of the invention to provide a magnetoresistive device using a magnetoresistive thin film which can obtain a large magnetoresistance ratio even at a low magnetic field and provide a low saturation magnetic field.

According to the invention, a magnetoresistive thin film, comprises:

a single crystalline substrate;

an (110)epitaxial buffer layer containing a body-centered cubic metal or an alloy thereof; and an (110)epitaxial Fe/Cr superlattice film;

wherein said Fe/Cr superlattice film has a microstructure in which staircase facets which have ridge lines along <100> and have {100} side surfaces stand side by side along <110> direction. The (110)epitaxial buffer layer may be two or more layers. The staircase facets should have the width of 5 to 30 run along <110> direction at the facet which appears on top surface and the deviation of the facet width should fall within ±50%. To provide the structure described above, the single crystalline substrate may include the substrate, such as sapphire($11\bar{2}0$) substrate, on which the (110)epitaxial buffer layer can grow, and the (110)epitaxial buffer layer may include a body-centered cubic metal such as vanadium, niobium, molybdenum, tantalum, tungsten and the like or may include an alloy containing two or more metals selected from the above body-centered cubic metals or containing any of the metals and Fe or Cr.

It is preferable that the epitaxial buffer layer has a two-layered structure in which a Cr film is formed on it, since the mismatching between the buffer layer and the Fe/Cr superlattice is reduced.

As described in the embodiments below, the variation of magnetoresistance effect and the saturation magnetic field of magnetoresistance show oscillatory dependence on the thickness of the Cr layer in the Fe/Cr superlattice film. Depending on a use, it is preferable that the thickness of the Cr layer is decided to balance between the magnetoresistance ratio and the saturation magnetic field, since the thickness of the Cr film at the peak of magnetoresistance ratio corresponds that at the peak of the saturation magnetic field.

On the other hand, the above-referenced "Microstructure Induced Magnetic Anisotropy in Fe/Cr(110) Superlattices" J. Appl. Phys. vol.73, pp.3922–3924 (1993) describes that the (110)Fe/Cr superlattice film is formed on the Ge(110) single crystalline substrate with using a molecular-beam epitaxial growth method and has the microstructure in which the staircase facets which have ridge lines along <100> and have {100} side surfaces stand side by side along <110> direction. However, the staircase facets thereof have the widths along <110> direction which are highly variable between 10 and 50 nm.

since the <100>-direction is parallel to the ridge lines of the staircase facets, due to the structural magnetic anisotropy of the staircase facets, <100> direction corresponds to an easy axis of magnetization, <110> direction corresponds to a hard axis of magnetization. Because of this, the saturation magnetic field of the magnetoresistance must be reduced when the magnetic field is applied to the <100>-direction. However, since, as mentioned above, the widths of the staircase facets thereof highly vary, the magnetic anisotropy energy of the staircase facets which is caused by the structural magnetic anisotropy will be distributed thereby causing that the saturation magnetic field of magnetoresistance is not reduced less than about 500 Oe.

The reason why the widths of the staircase facets highly vary is presumed that the nucleation growth at the initial stage of the growing of Fe/Cr superlattice film does not uniformly occur. This appears to be caused by that nonuniform alloying reaction of Fe or Cr with the substrate material, Ge occurs.

In the magnetoresistive thin-film according to the invention, the epitaxial buffer layer which is in the form of a (110) oriented body-centered cubic crystal which is suitable for growing a (110) Fe/Cr superlattice is provided between the substrate and the Fe/Cr superlattice. Therefore, the magnetoresistive thin-film of the invention has an advantage that the nuclear growth at the initial stage of growing Fe/Cr superlattice occurs uniformly and thereby the dispersion of the width of the staircase facet obtained can be controlled within ±50%. The width of the staircase facet can be controlled the temperature and rate of the growth of the Fe/Cr superlattice.

Meanwhile, such a single crystalline Fe/Cr superlattice film requires to be epitaxially grown by the so-called molecular beam epitaxy method in ultrahigh vacuum. In the epitaxial growth, the similarity of crystal symmetry and the low lattice mismatch between the substrate or buffer layer and the material grown thereon is required. Furthermore, in the substrate which is made of a material such as Ge, Si which is highly reactive with a transition metal such as Fe, Cr, it is difficult for the staircase facets which have the regular structure to be formed, and the margin of the making condition is limited. Accordingly, When the Fe/Cr superlattice film is grown, the similarity of crystal symmetry, lattice mismatch and chemical reactivity with the growing material should be considered.

Japanese Patent Application Laid-Open No. 4-200748 discloses, as a substrate and a buffer layer which are suitable for making a Fe/Cr superlattice film, the combination of sapphire substrate and the epitaxial buffer which is a body-centered crystalline metal selected from V, Cr, Nb, Mo, Ta and W or a body-centered crystalline alloy made of at least two metals of the body-centered crystalline metal or a body-centered crystalline alloy made of Fe or Cr and the body-centered crystalline metal. It also discloses that the epitaxial buffer layer has a two-layered structure in which the lower layer is made of the body-centered crystalline metal selected from V, Cr, Nb, Mo, Ta and W or the body-centered crystalline alloy made of at least two metals of the body-centered crystalline metal or the body-centered crystalline alloy made of Fe or Cr and the body-centered crystalline metal, and the upper layer is made of Cr. It describes that a high-quality epitaxial Fe/Cr superlattice can be grown since the lattice mismatch between the buffer layer and the Fe/Cr superlattice is reduced owing to the existence of the upper layer of Cr.

In the present invention, when the (110)-oriented Fe/Cr superlattice is grown on the (110)-oriented epitaxial buffer layer, the temperature of the substrate and the rate of growth is controlled less than 300 degree C. and 2 nm/sec., respectively, whereby the diffusion length of adatoms along <110>-direction at the surface is controlled thereby obtaining the microstructure which the staircase facets which have ridge lines along <100>-direction and {100} side surfaces stand side by side to <110>-direction. However, the reason why the anisotropy in the diffusion length of the adatoms at the surface is not found until now.

In the magnetoresistive thin-film of the invention, since the (110)-oriented Fe/Cr superlattice film is grown on the (110)-oriented epitaxial buffer layer which has high-quality and flat surface, the uniform nuclear growth can be performed at the initial stage of growing the film, and the staircase facets which are formed along with the growth of the Fe/Cr superlattice film have uniform width at <110> direction.

The average of the widths of the staircase facets is dependent upon the temperature and rate of the growth of the Fe/Cr superlattice film. For example, if the rate of the growth is 0.01 nm/s, then the widths of the staircase facets are from 50 to 10 nm when the temperature of the substrate falls from 300 to 100 degree C. The dispersion of the widths of the staircase facets falls within ±50% at any growth temperature. Due to the formation of staircase facets, the direction of the ridge lines, i.e., <100>-direction becomes a easy axis of magnetization, and the direction of the alignment of the facets, i.e., <110>-direction becomes a hard axis of magnetization. Thereby the saturation magnetic field of magnetoresistance effect is reduced when the magnetic field is applied along the <110> direction. The magnitude of the <100>-direction saturation magnetic field is depending upon the width of the staircase facets, and it becomes less than 500 Oe when the widths of the staircase facets are 5 to 30 nm and the dispersion thereof fall within ±50%.

BRIEF DESCRIPTION OF THE DRAWINGS

The invention will be explained in more detail in conjunction with the appended drawings, wherein.

DESCRIPTION OF THE PREFERRED EMBODIMENTS

A magnetoresistive thin-film in preferred embodiments of the invention will be described below with reference to the drawings.

Figure 1A:
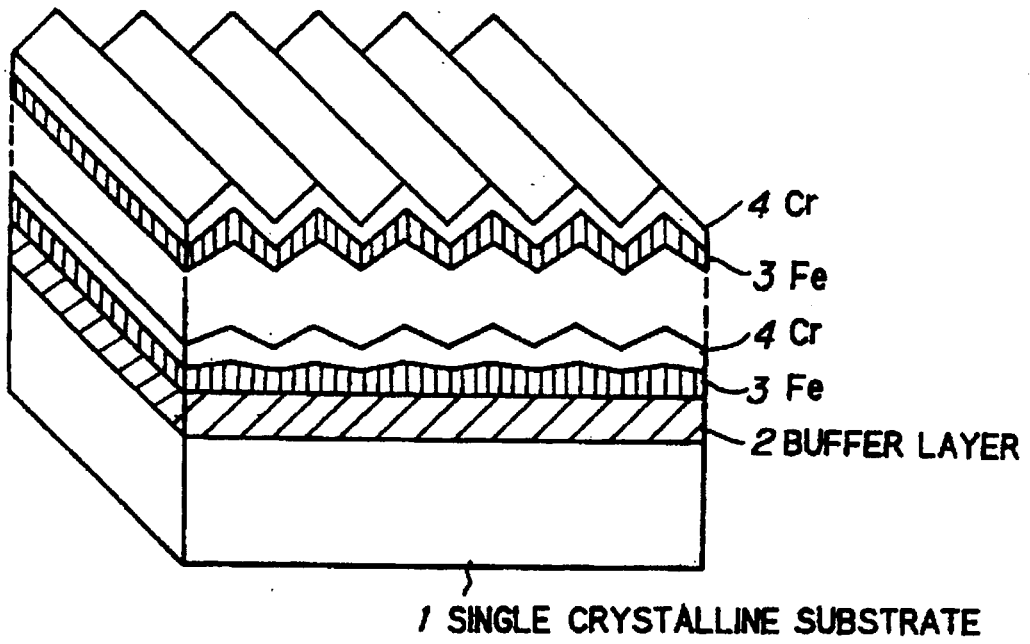
FIGS. 1A and 1B are cross-sectional perspective views showing magnetoresistive thin-films of preferred embodiments according to the invention.

FIG. 1A shows a magnetoresistive thin-film in a first preferred embodiment of the invention, which a (110) oriented epitaxial buffer layer 2 made of a body-centered cubic crystalline metal or alloy is formed on a single crystalline substrate 1, thereon with layering a (110) oriented epitaxial Fe/Cr superlattice film on which Fe layers 3 and Cr layers 4 are alternately epitaxially grown, wherein the Fe/Cr superlattice has a structure in which staircase facets which have ridge parallel to the <100> direction at (110) surface and have {100} side surfaces stand side by side to the <110> direction. The staircase facets which appear at the top surface of the superlattice have widths in the range of 5 to 30 nm in the <110> direction, and the dispersion of the widths falls within ±50%.

Figure 1B:
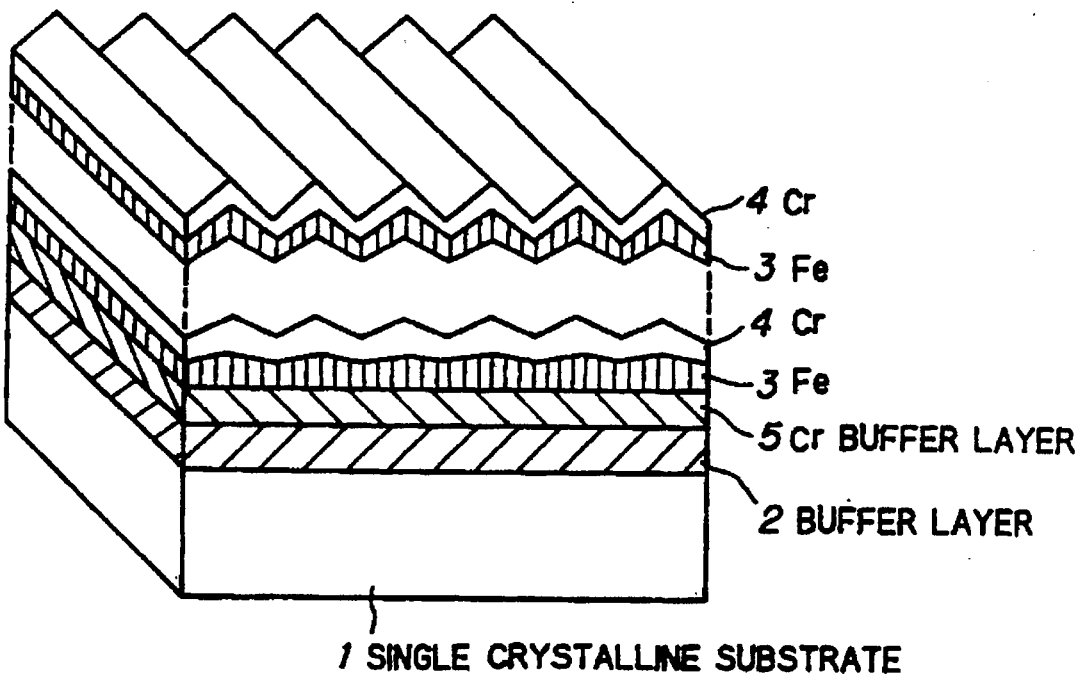

FIG. 1B shows a magnetoresistive thin-film in a second preferred embodiment of the invention, characterized in that it has a two-layered <110> oriented epitaxial buffer in which the upper layer is a (110) oriented Cr buffer layer. The other components are the same as that in FIG. 1A.

Figure 2:
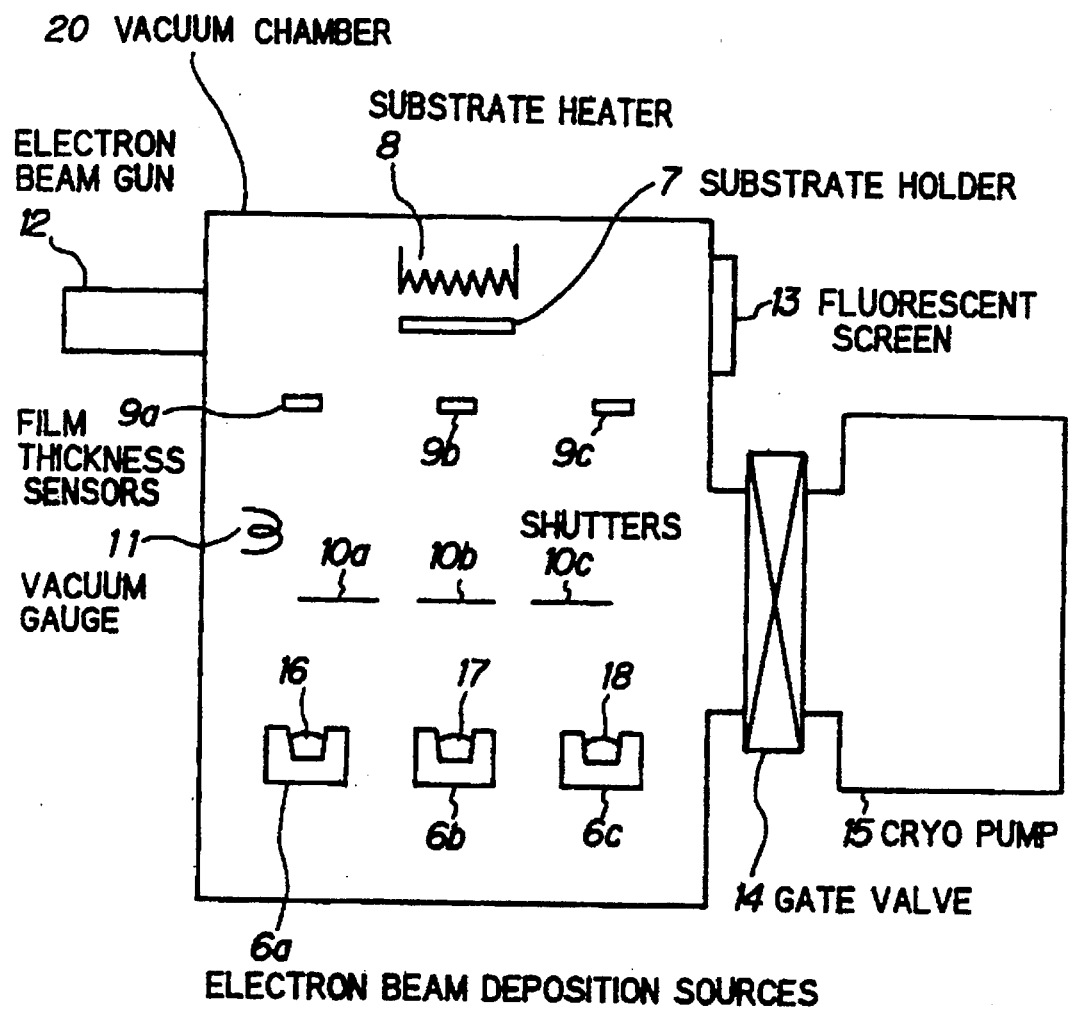
FIG. 2 is an explanatory view showing an ultrahigh vacuum deposition system used for making the magnetoresistive thin-film according to the invention.

To make the magnetoresistive thin-film as described above, the ultrahigh vacuum deposition system as shown in FIG. 2 is used. The ultrahigh vacuum deposition system is composed of a vacuum chamber 20 which is provided with two electron beam deposition sources 6a and 6b which contains Fe 16 and Cr 17 respectively, an electron beam deposition source 6c which contains a metal or an alloy 18 for forming the buffer layer, a substrate holder 7 which is mounted with a single crystalline substrate (not shown), a heater 8 for heating the substrate, three quartz-crystal thickness sensors 9a, 9b and 9c for monitoring the deposition rate at the respective electron beam deposition source 6a to 6c, shutters 10a, 10b and 10c for controlling a quantity of molecular beam from the electron beam deposition sources 6a to 6c, a vacuum gauge 11, and an electron beam gun 12 and; a fluorescent screen 13 for a RHEED (Reflection High-Energy Electron Diffraction) analysis by which the surface structures of the buffer layer which is grown on the single crystalline substrate and Fe and Cr layers are monitored. A cryo pump 15 is connected to the vacuum chamber 20, thereby the pressure in the vacuum chamber 20 is kept in the ultra-high vacuum range through a gate valve 14. To obtain an ultra-high vacuum, a heater (not shown) is provided in the circumference of the vacuum chamber 20 to bake out it. The base pressure is as low as $1 \times 10^{-10}$ Torr, and the working pressure is in the order of $10^{-9}$ Torr.

The magnetoresistance is measured by a direct-current four-terminal method in the magnetic field up to 500 Oe at room temperature with using a photo-lithographically patterned film. Al wires are ultra-sonically bonded to the pattern.

EXAMPLE 1

In order to grow a (110) oriented body-centered cubic crystalline Fe/Cr superlattice, in the consideration of the symmetry, it is necessary to select at least the body-centered cubic crystalline epitaxial buffer layer as mentioned above and the substrate material which is able to grow it. As the metals which are body-centered cubic crystalline and easy to handle, only V, Cr, Fe, Nb, Mo, Ta and W is satisfactory. Therefore, when the possible substrate material to grow (110) orientation epitaxial film from these metal or the alloys therebetween is investigated, the result as shown below in Table 1 is obtained. The orientation of the epitaxial film is characterized by RHEED and X-ray diffraction. The purity of the metal ingot employed is 99.9 to 99.999%, the rate of deposition is 0.01 to 0.03 nm/s, the temperature of the substrate is in the range of 350° to 1100° C. (in Table 1, the growth temperature which is determined when the (110) epitaxial film is obtained is recorded). In the judge of the epitaxial film in Table 1, 'o' indicates that the (110) orientation epitaxial metal film is obtained, and 'x' indicates that a polycrystalline film or textured film is obtained. Though the effect of the film thickness of the buffer layer on the orientation of the film was investigated to be varied from 1 to 200 nm, no change is found therebetween.

As seen in Table 1, the body-centered cubic crystalline (110) oriented epitaxial buffer layer can be obtained, when V, Cr and Fe are deposited on MgO(110), SrTiO$_3$(110), LiNbO$_3$(11$\bar{2}$0), LiTaO$_3$(11$\bar{2}$0) and quartz crystal (SiO$_2$)(11$\bar{2}$0) substrates, or metals 'M'(M=V, Nb, Mo, Ta, W), Fe or Cr or alloys therebetween are deposited on V(110), Nb(110), Mo(110), Ta(110) and W(110) bulk-single crystal substrates, in addition to when the above metal 'M' is deposited on the sapphire(11$\bar{2}$0) substrate as disclosed in Japanese Patent Application Laid-Open No.4-200748.

TABLE 1

| Substrate material | Buffer layer metal or alloy | Growth temp. (°C.) | Judge of epitaxial film |
| --- | --- | --- | --- |
| sapphire (11$\bar{2}$0) | Fe | 800 to 1000 | x |
| | Cr | | x |
| | V | | o |
| | Sb | | o |
| | Mo | | o |
| | V$_{40}$Ta$_{60}$ | | o |
| | W$_{15}$Nb$_{85}$ | | o |
| | V$_{40}$Cr$_{60}$ | | o |
| | W$_{15}$Fe$_{85}$ | | o |
| MgO(001) | Fe, Cr | 400 to 500 | o |
| SrTiO$_3$(110) | | | o |
| LiNbO$_3$(11$\bar{2}$0) | | | o |
| LiTaO$_3$(11$\bar{2}$0) | | | o |
| SiO$_2$(11$\bar{2}$0) | | | o |
| MgO(001) | V | 800 to 900 | o |
| SrTiO$_3$(110) | | | o |
| LiNbO$_3$(11$\bar{2}$0) | | | o |
| LiTaO$_3$(11$\bar{2}$0) | | | o |
| SiO$_2$(11$\bar{2}$0) | | | o |
| V(110) | V, Nb, Mo, Ta, W | 800 to 1000 | o |
| Nb(110) | V, Nb, Mo, Ta, W | 800 to 1000 | o |
| Mo(110) | V, Nb, Mo, Ta, W | 800 to 1000 | o |
| W(110) | V, Nb, Mo, Ta, W | 800 to 1000 | o |

The substrate materials in which (110) oriented epitaxial metal film can be obtained in Table 1 does not have significant difference therebetween regarding the test results as described below. Therefore, in the examples below, as the representative example of the first embodiment as shown in FIG. 1A, employed is a sapphire($11\bar{2}0$) substrate as the single crystalline substrate 1, a body-centered cubic crystalline metal 'M'(M=V, Nb, Mo, Ta, W), the body-centered cubic crystalline alloys composed of two or more selected from the metal 'M', or the body-centered cubic crystalline alloys composed of Fe or Cr and the body-centered cubic crystalline metal 'M', as the (110) oriented epitaxial buffer layer 2 made of a body-centered cubic crystalline metal or alloy.

On the other hand, as the representative example of the second embodiment as shown in FIG. 1B, employed is a sapphire($11\bar{2}0$) substrate as the single crystalline substrate 1, a body-centered cubic crystalline metal 'M'(M=V, Nb, Mo, Ta, W), the alloys composed of two or more selected from the metal 'M' or the alloys composed of Fe or Cr and the body-centered cubic crystalline metal 'M' as the lower buffer layer 2 of the two-layered epitaxial buffer layer 2, a Cr epitaxial buffer layer as the upper buffer layer 5 thereof.

EXAMPLE 2

The relations between the (110) oriented epitaxial buffer layer and the growth orientation of the epitaxial Fe/Cr superlattice will be described below. As the result of the experiment, the epitaxial buffer layers which are composed of any one of V, Nb, Mo, Ta and W, or the body-centered cubic crystalline alloys composed of the at least two metals selected from the above metals or the alloys composed of Fe or Cr and any one of the above metals do not have significant difference therebetween. Therefore, in the examples below, Fe/Cr superlattice film on the Nb(110) buffer layer will mainly be explained.

The 10-nm-thick Nb(110) buffer layer is grown on the sapphire ($11\bar{2}0$) single crystalline substrate at the growth rate of 0.01 nm/s and the substrate temperature of 900° C., the epitaxial growth of the Fe/Cr superlattice on the Nb (110) buffer layer is characterized by RHEED and X-ray diffraction analyses. The purity of the ingot of Nb, Fe or Cr employed is 99.99, 99.999 or 99.9%, respectively.

Figure 3A:
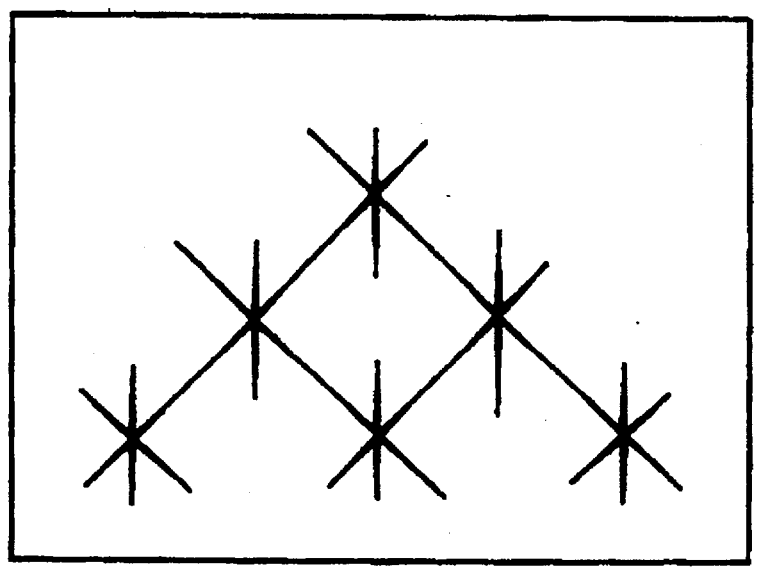
FIGS. 3A and 3B are RHEED(Reflection High-Energy Electron Diffraction) patterns of a (110)-oriented Fe/Cr superlattice film according to the invention.
Figure 3B:
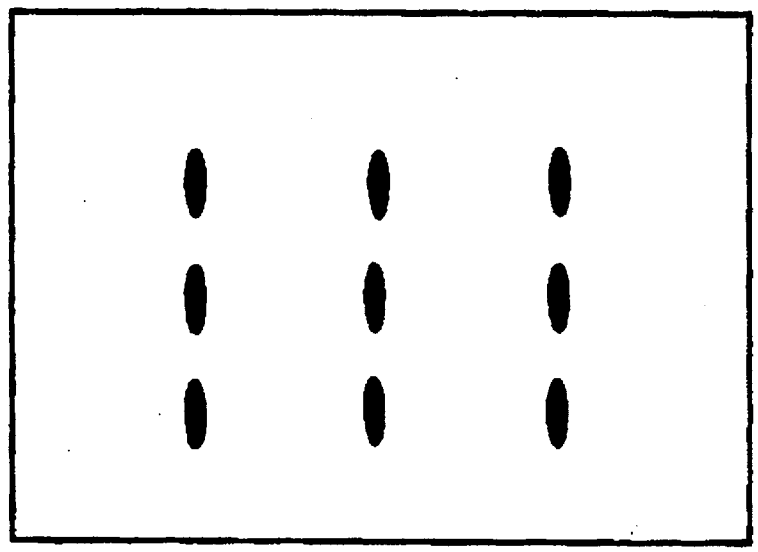

As shown in Table 1, when the Nb(110) film is epitaxially grown on the sapphire ($11\bar{2}0$) substrate, the epitaxial relations of sapphire($11\bar{2}0$) face ∥ Nb(110) face, and sapphire[0001] axis ∥ Nb[-111] axis are obtained. Then, the superlattice with twenty periods of Fe film of 3 nm and Cr film of 3 nm (referred as [Fe(3 nm)/Cr(3 nm)]$_{20}$ hereinafter) is grown on the Nb (110) buffer layer at the growth rate of 0.02 nm/s and the substrate temperature varying from room temperature to 350° C. The obtained RHEED patterns of Fe/Cr superlattice are basically independent of the substrate temperature as shown in FIGS. 3A and 3B. FIG. 3A shows RHEED pattern along the [100] direction, and FIG. 3B shows RHEED pattern along the [110] direction.

From the patterns in FIGS. 3A and 3B, it is understood that the Fe/Cr superlattice epitaxially grows on the Nb(110) buffer layer and it has the epitaxial relations of Nb(110) face ∥ Fe/Cr superlattice (110) face, and Nb[-111] axis ∥ Fe/Cr superlattice [-111] axis, and that it has a microstructure in which staircase facets which have the <100> direction ridge lines and {100} side surfaces stand side by side to the <110> direction as shown in FIG. 1A. The epitaxial relation to the (110) buffer layer and the microstructure of the staircase facets are independent of the order of the growth of the superlattice, and the results do not change between the first growing of Fe and the first growing of Cr.

EXAMPLE 3

Figure 4C:
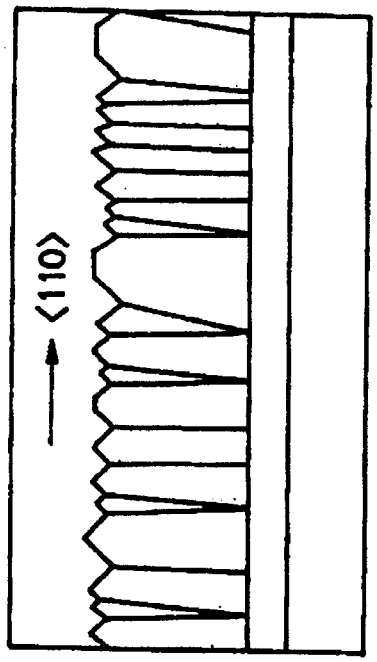
FIGS. 4C and 4D are TEM(Transmission Electron Microscopy) images of cross sections along <100>-axis and <110>-axis respectively of a Fe/Cr superlattice film in a comparative example.
Figure 4D:
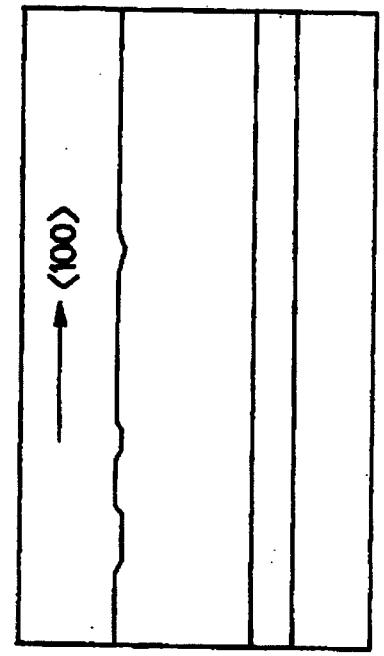
Figure 4A:
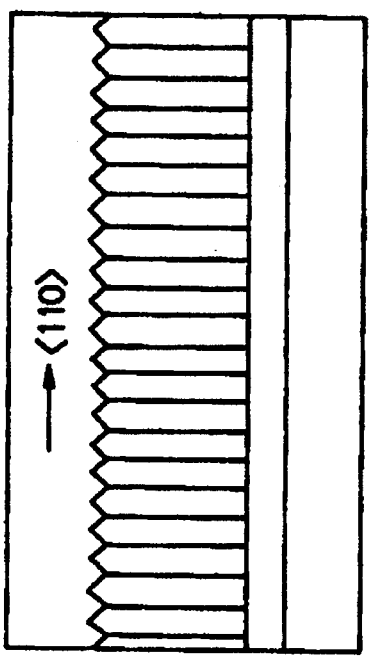
FIGS. 4A and 4B are TEM(Transmission Electron Microscopy) images of cross sections along <100>-axis and <110>-axis respectively of a Fe/Cr superlattice film according to the invention.
Figure 4B:
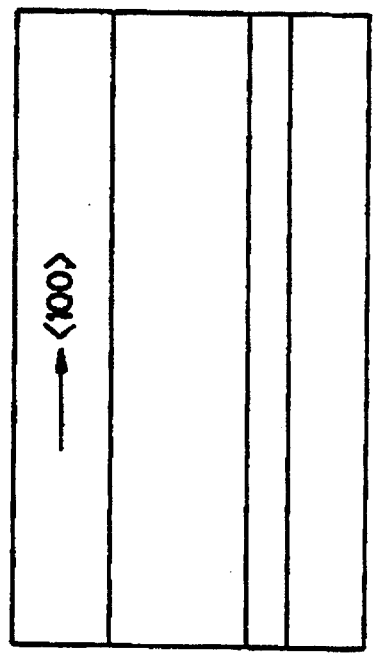

When a superlattice is grown on a Nb (110) buffer layer (film thickness of 1 nm) grown on a sapphire ($11\bar{2}0$) substrate and the other superlattice which is prepared as a comparative example is grown on a Ge (110) substrate without a buffer layer, in the same condition of the growth temperature of 200° C. and the growth rate of 0.02 nm/s [Fe(3 nm)/Cr(1 nm)]$_{30}$ superlattices are obtained. The sample pieces with cross sections respectively perpendicular to the <100> and <110> axes are prepared by an ion polishing method and they are observed by TEM (Transmission Electron Microscopy). FIGS. 4A and 4B show TEM images at the cross sections respectively perpendicular to the <100> and <110> axes of the Fe/Cr superlattice on the sapphire ($11\bar{2}0$) of the invention, FIGS. 4C and 4D show TEM images at the cross sections respectively perpendicular to the <100> and <110> axes of the Fe/Cr superlattice on the Ge(110) substrate of the comparative example.

Figure 5A:
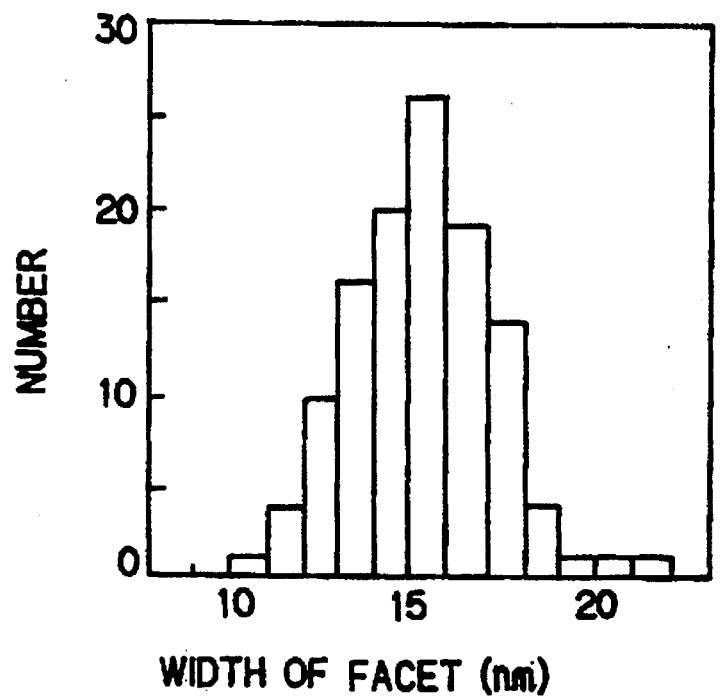
FIGS. 5A and 5B are graphs showing distribution of widths of staircase facets.
Figure 5B:
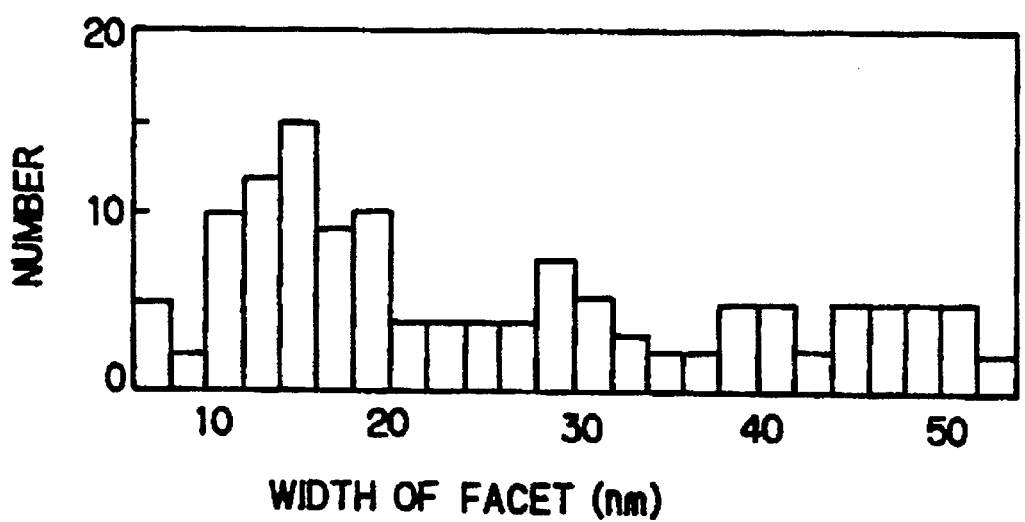

In both superlattices, while the formation of staircase surface is observed by the TEM images at the cross section perpendicular to the <100> axis, the formation of flat surface is observed by the TEM images at the cross section perpendicular to the <110> axis. Therefore, it is proved that they have the microstructure in which the staircase facets which have the <100> direction ridge lines and the {100} side surfaces stand side by side as shown in FIG. 1A. On the other hand, as clearly seen in the comparison between FIG. 4A and FIG. 4C, the widths of the staircase facets in FIG. 4C are not uniform whereas that in FIG. 4A are uniform. Then, many sample pieces at the cross section perpendicular to the <100> axis are prepared, and the widths of the staircase facets are measured by TEM. The result is shown in histograms of FIGS. 5A and 5B. As seen from FIGS. 5A and 5B, the widths of the staircase facets of the Fe/Cr superlattice on the sapphire($11\bar{2}0$) substrate according to the invention is sufficiently uniform and the dispersion thereof falls within ±50% (FIG. 5A), while the widths of the staircase facets of the Fe/Cr superlattice on the Ge (110) substrate of the comparative example is highly dispersed (FIG. 5B).

EXAMPLE 4

The relation between the widths in the <110> direction of the staircase facets formed in the (110) oriented Fe/Cr superlattice and the growth temperatures of the superlattice thereof is investigated.

Figure 6:
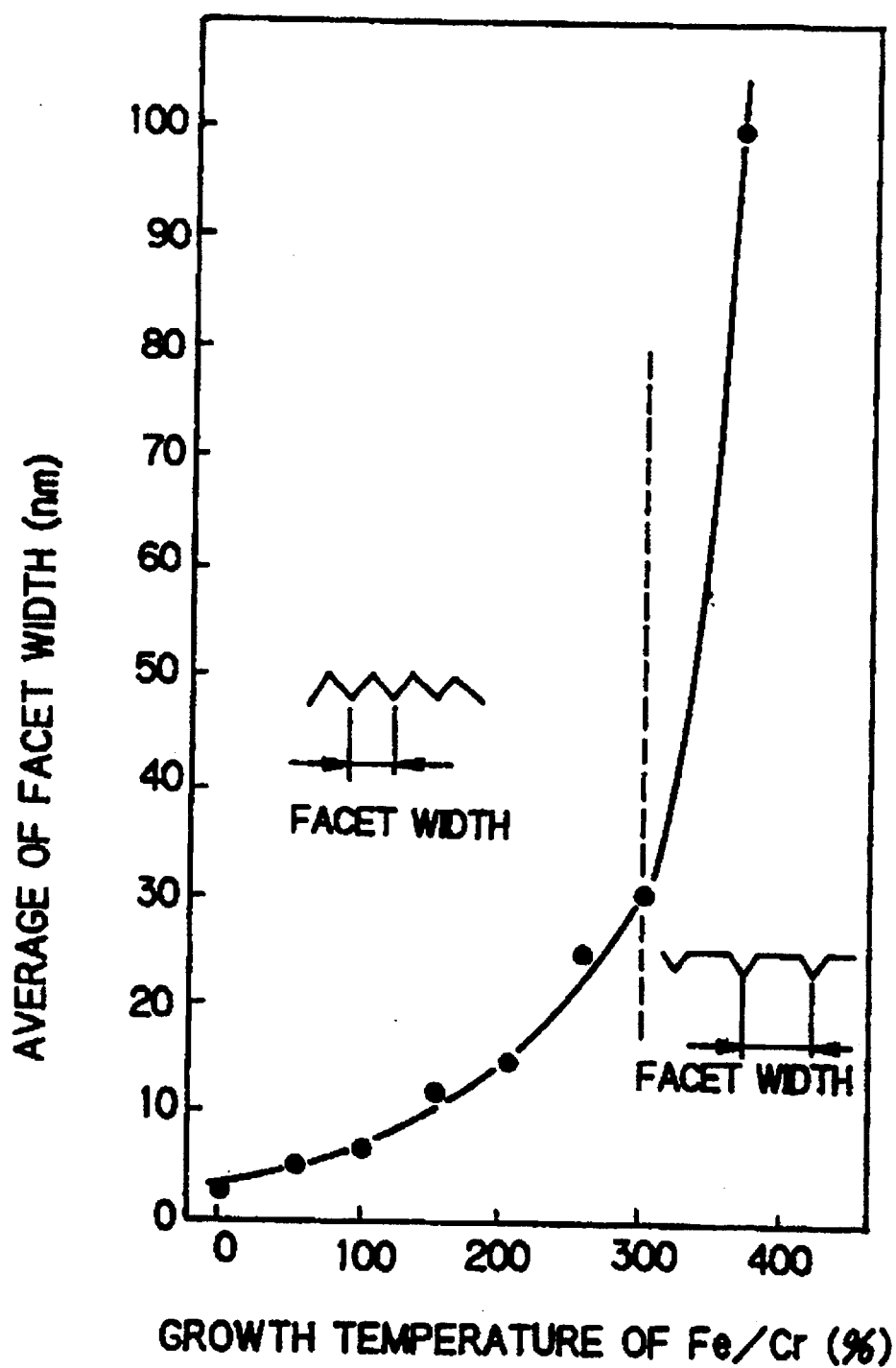
FIG. 6 is a graph showing a temperature dependence of widths of staircase facets.

When superlattices are grown on a Nb (110) buffer layer (film thickness of 10 nm) in the condition of the growth rate of 0.02 nm/s while varying the growth temperature, [Fe(4 nm)/Cr(2 nm)]$_{30}$ superlattices are obtained. The widths of the <110> direction staircase facets thereof are measured by SEM (Scanning Electron Microscopy). The widths of the <110> direction staircase facets are dependent upon the growth temperature of the Fe/Cr superlattice and increase with the increase of the growth temperature, as shown in FIG. 6. When the growth temperature is more than 300° C., the facets tend to be in the form of trapezoidal (as shown by the right side illustration in FIG. 6) rather than staircase and the width of the facet suddenly increases. Meanwhile, the dispersion of the widths of the <110> direction staircase facets falls within ±50% in any case.

EXAMPLE 5

The effects of the growth rate on the widths of the staircase facets of the (110) orientated Fe/Cr superlattice will be described below. A [Fe(3.2 nm)/Cr(0.9 nm)]$_{20}$ superlattice is grown on the Nb (110) buffer layer. When the growth temperature is constant at 200° C. and the growth rate is varied in the range of from 0.005 to 5.0 nm/s, the existence of the staircase facet (also the widths of the facets if the facet growth is seen) is observed. The result is shown in Table 2 below. In Table 2, it is understood that the growth of the staircase facets can be seen when the growth temperature is 200° C. and the growth rate is less than 2.0 nm/s. It is also understood that the width of the staircase facet obtained becomes large as the growth rate becomes low. Meanwhile, in Table 2, the width of the facet of ~0 means that the staircase facet is not grown.

TABLE 2

| Growth rate of superlattice (nm/sec.) | Average of the width of staircase facet (nm) |
| --- | --- |
| 0.005 | 35 |
| 0.01 | 30 |
| 0.02 | 15 |
| 0.1 | 10 |
| 1.0 | 7 |
| 2.0 | 5 |
| 5.0 | ~0 |

EXAMPLE 6

Figure 7:
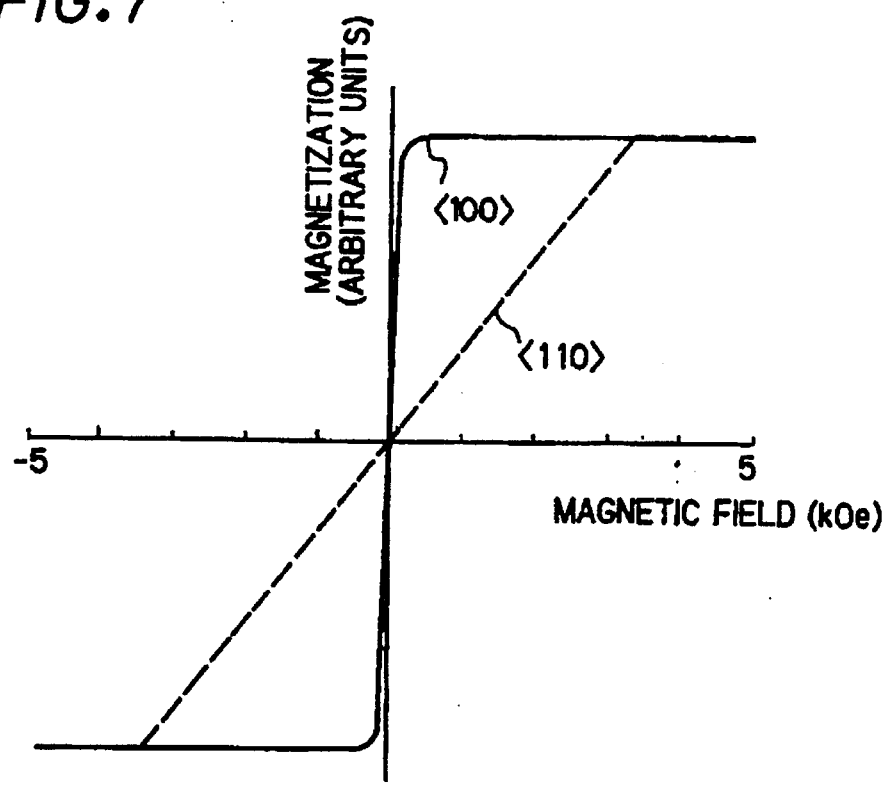
FIG. 7 is a graph showing a magnetization curve.

The in-plane magnetic anisotropy of [Fe(3 nm)/Cr(1 nm)]$_{30}$ superlattice which is grown on the 10-nm-thick Nb(110) buffer layer at the growth temperature of 200° C. and the growth rate of 0.01 nm/s is measured by a vibrating sample magnetometer. The measurement is conducted at room temperature with applying a magnetic field of 5 kOe at a maximum to the <100> and <110> directions. In FIG. 7, a magnetization curve when the magnetic field is applied to the <100> and <110> directions is shown. Herein, because of the structural magnetic anisotropy based on the structure of staircase facet, the <100> axis is an easy axis of magnetization, whereas the <110> axis is a hard axis of magnetization.

EXAMPLE 7

Figure 8:
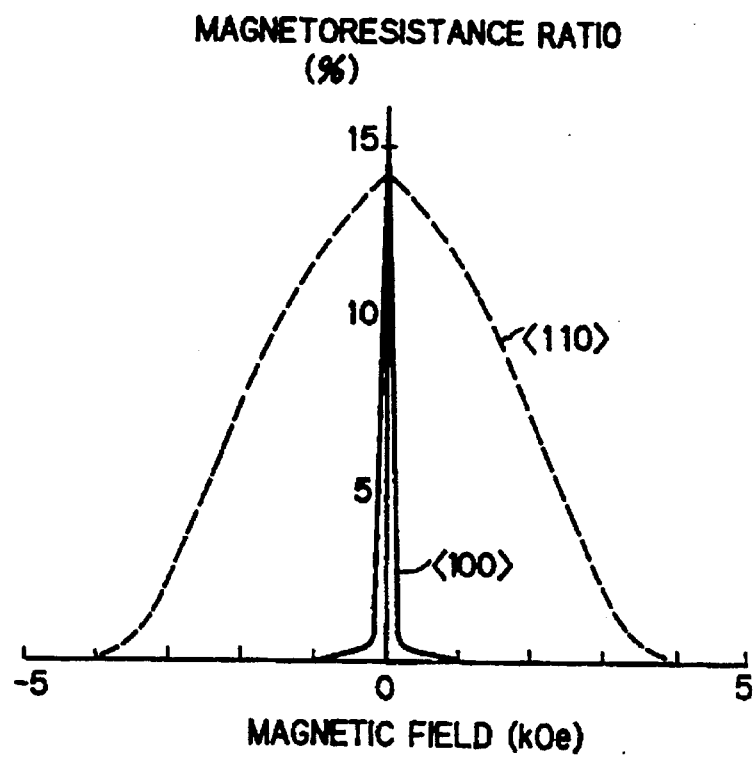
FIG. 8 is a graph showing a magnetic field dependence of magnetoresistance ratio.

The sample of Example 6 is photolithographically patterned for resistance measurement in the configuration of the current parallel to <100> direction. The magnetoresistance thereof is measured by a direct current four-terminal method at room temperature. The magnetic field is applied parallel to the <100> direction, i.e., parallel to the direction of the current flow, or parallel to the <110> direction, i.e., in perpendicular to the direction of the current flow. The respective magnetoresistance curves are shown in FIG. 8. Caused by the difference of the magnetic anisotropy, when the magnetic field of <100> direction is applied, the value of the saturation magnetoresistance is 100 Oe that is smaller than that of the saturation magnetoresistance for <110> direction, 3.4 kOe. In this case, the magnetoresistance ratio is 14% for both magnetic field direction. Herein, the magnetoresistance ratio is the ratio of the resistance $R_0$ in magnetic field of 0 and the resistance Rs in the magnetic field of saturation of magnetoresistance, i.e., $(R_0-R_s) \times 100/R_s$.

Thus, the magnetoresistance thin-film of the invention, when the magnetic field is disposed to apply <100> direction, can obtain the variation of magnetoresistance more than 10% in a small magnetic field since it has the microstructure in which the staircase facets which have the ridge lines parallel to <100> direction stand side by side.

EXAMPLE 8

Figure 9:
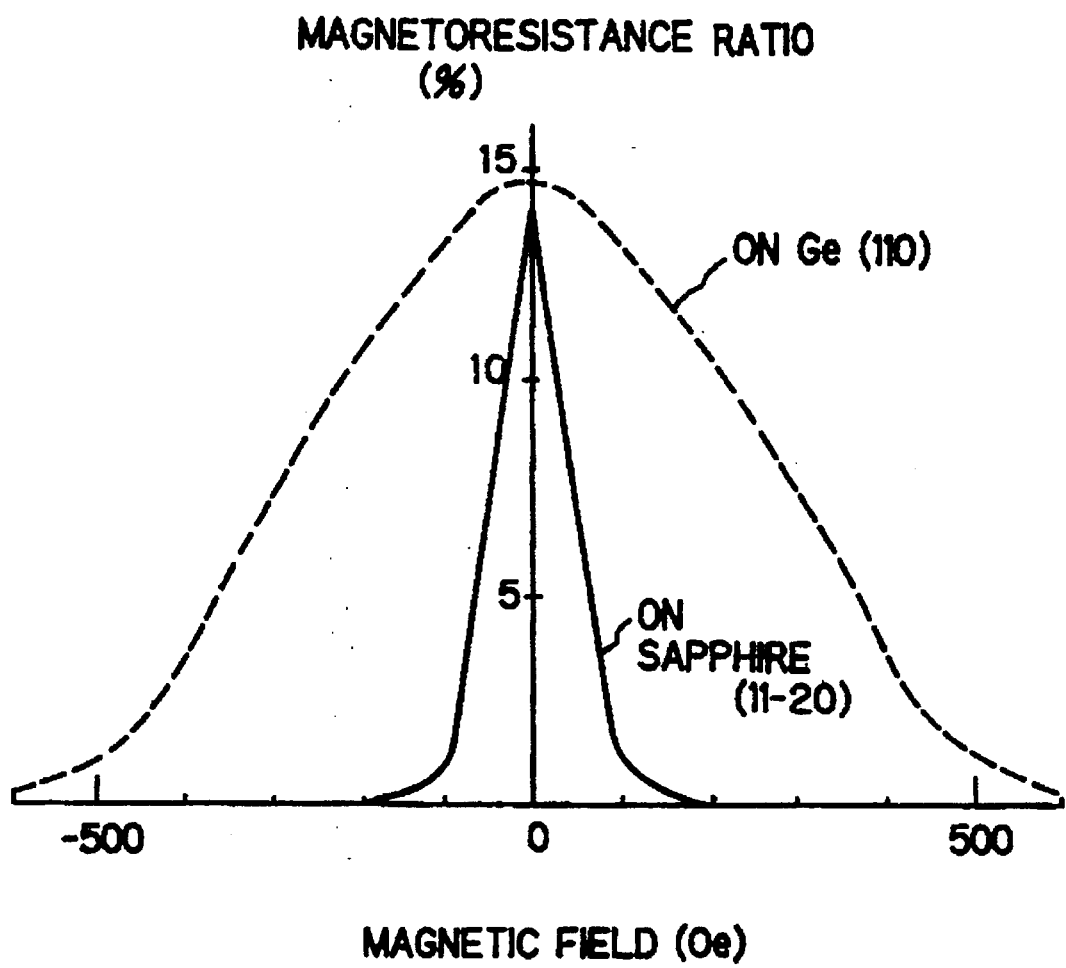
FIG. 9 is a graph showing a magnetic field dependence of magnetoresistance ratio.

With respect to the two [Fe(3 nm)/Cr(1 nm)]$_{30}$ superlattices prepared in EXAMPLE 3, i.e., one is on the sapphire (11$\bar{2}$0) substrate and the other is on the Ge(110) substrate, the magnetoresistance is measured in a similar way in EXAMPLE 7. FIG. 9 shows their magnetoresistance curves when magnetic field is applied parallel to the <110> direction. (The reason why the magnetoresistance ratio of the Fe/Cr superlattice on the sapphire (11$\bar{2}$0) substrate is less than that on the Ge (110) substrate in FIG. 9 is that the former sample has a current by-pass due to the buffer layer.) Though, as shown in FIG. 3, the most probable values of the widths of the <110> direction staircase facets formed in both superlattices are nearly equal, the dispersion of the facet widths is different from each other, i.e., the dispersion of the Fe/Cr superlattice grown on the sapphire (11$\bar{2}$0) substrate according to the invention falls within ±50% while that of the Fe/Cr superlattice grown on the Ge (110) substrate according to the comparative example is very large. From this difference, when the magnetic field is applied parallel to the <100> direction, the magnetoresistance of the former is less than that of the latter. Accordingly, it will be appreciated that to lower the value of the saturation magnetic field the dispersion of the widths of the <110> direction staircase facets must fall within ±50%.

EXAMPLE 9

With respect to the samples prepared in EXAMPLE 4 which have the staircase facets with different widths caused by the difference in the growth temperature of the Fe/Cr superlattice, the saturation magnetic field of the magnetoresistance when the magnetic field is applied parallel to the <100> direction is measured. The result is shown in Table 3. As seen from Table 3, when the average of the facet widths is 5 to 30, the saturation magnetic field of the magnetoresistance becomes 500 or less Oe.

TABLE 3

| Growth temp. of Fe/Cr superlattice (°C.) | Average of width of staircase facets (nm) | <100> direction saturation magnetic field (Oe) |
| --- | --- | --- |
| 0 | 2 | 600 |
| 50 | 5 | 500 |
| 100 | 7 | 250 |
| 150 | 11 | 70 |
| 200 | 15 | 100 |
| 250 | 25 | 320 |
| 300 | 30 | 500 |
| 350 | 100 | 1800 |

EXAMPLE 10

With respect to the samples prepared in EXAMPLE 4 which have the staircase facets with different widths caused by the difference in the growth rate of the Fe/Cr superlattice, the saturation magnetic field of the magnetoresistance when the magnetic field is applied parallel to the <100> direction is measured. The result is shown in Table 4. As seen from Table when the average of the facet widths is 5 to 30, the saturation magnetic field of the magnetoresistance becomes 500 or less Oe.

TABLE 4

| Growth rate of Fe/Cr superlattice (nm/sec.) | Average of width of staircase facets (nm) | <100> direction saturation magnetic field (Oe) |
| --- | --- | --- |
| 0.005 | 35 | 620 |
| 0.01 | 30 | 400 |
| 0.02 | 15 | 50 |
| 0.1 | 10 | 135 |
| 1.0 | 7 | 365 |
| 2.0 | 5 | 500 |
| 5.0 | ~0 | 3000 |

In EXAMPLES below, with respect to the epitaxial Fe/Cr superlattice grown on the epitaxial buffer layer which is composed of any one of V, Nb, Mo, Ta and W, or the body-centered cubic crystalline alloys composed of the at least two metals selected from the above metals or the body-centered cubic crystalline alloys composed of Fe or Cr and any one of V, Nb, Mo, Ta and W or the mixtures thereof, formed on the sapphire single crystalline substrate, the variation of the magnetoresistance and the saturation magnetic field at room temperature are measured.

EXAMPLE 11

The dependence of the magnetoresistance ratio and the saturation magnetic field on the thickness of the Cr film in the Fe/Cr superlattice when the metal or alloy composing the epitaxial buffer layer is varied is investigated.

Figure 10:
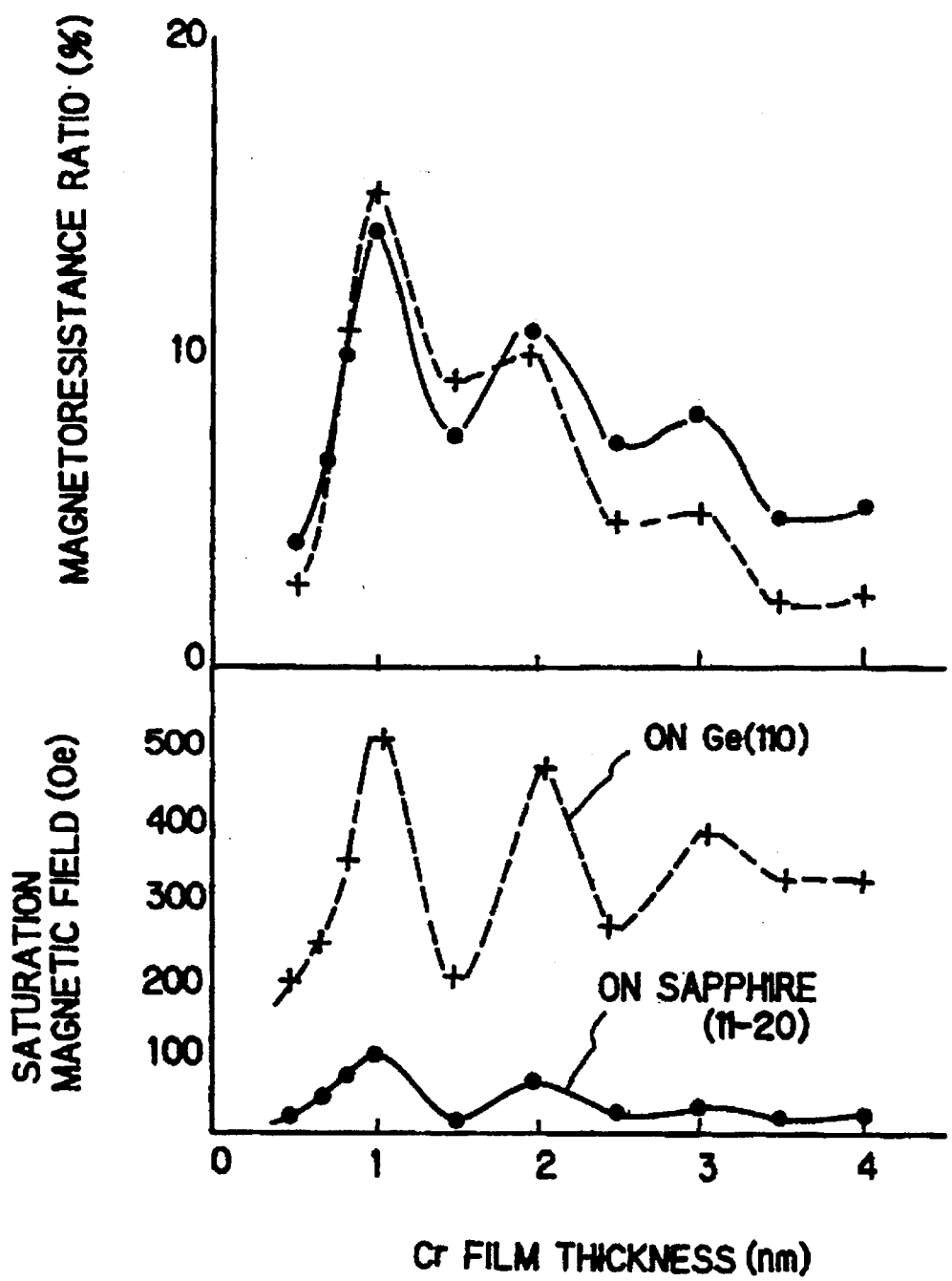
FIG. 10 is a graph showing a Cr-film thickness dependence of magnetoresistance ratio and a saturation magnetic field.

As the result of the experiment, the epitaxial buffer layers which are composed of any one of V, Nb, Mo, Ta and W, or the body-centered cubic crystalline alloys composed of the at least two metals selected from the above metals or the alloys composed of Fe or Cr and any one of the above metals or the mixtures thereof do not have significant difference therebetween. Therefore, hereinafter, the result regarding the epitaxial Fe/Cr superlattice film on the $V_{20}Nb_{30}$ buffer layer will be described. The film thickness of the (110) oriented epitaxial buffer layer is 5 nm, and the buffer layer is grown at the growth temperature of 850° to 900° C. and the growth rate of 0.02 nm/s. On the other hand, the growing of the Fe/Cr superlattice which has 3-nm-thick Fe layers and Cr films of thickness varying from 0.5 to 4 nm is grown at the substrate temperature of 200° C. and the growth rate of 0.02 nm/s. The pattern for determining the magnetoresistance is made by a photolithography in order that the <100> direction and the direction of current flow becomes parallel, and the magnetic field is applied to the direction perpendicular thereto, i.e., to the <110> direction. The result thereof is shown in FIG. 10. Meanwhile, as a comparative example, the (110) orientation Fe/Cr superlattice grown on the Ge (110) substrate in the same growth condition is referenced. (In the comparative example regarding the Ge (110) substrate, the Fe/Cr superlattice is directly grown on the substrate without the $V_{20}Nb_{30}$ buffer layer.) The magnetoresistive thin-film according to the invention can lower the saturation magnetic field of magnetoresistance, as compared with the conventional Fe/Cr superlattice film grown on the Ge (110) substrate.

EXAMPLE 12

The example in which the epitaxial buffer layer on the sapphire($11\bar{2}0$) substrate is in the form of two-layer structure is investigated. With regard to effects of the lower epitaxial buffer layers, which are composed of any one of V, Nb, Mo, Ta and W, or the body-centered cubic crystalline alloys composed of the at least two metals selected from the above metals or the alloys composed of Fe or Cr and any one of the above metals or the mixtures thereof, they do not have significant difference therebetween. Therefore, hereinafter, the result regarding the samples grown on the $V_{50}Mo_{50}$ buffer layer will be described.

Figure 11:
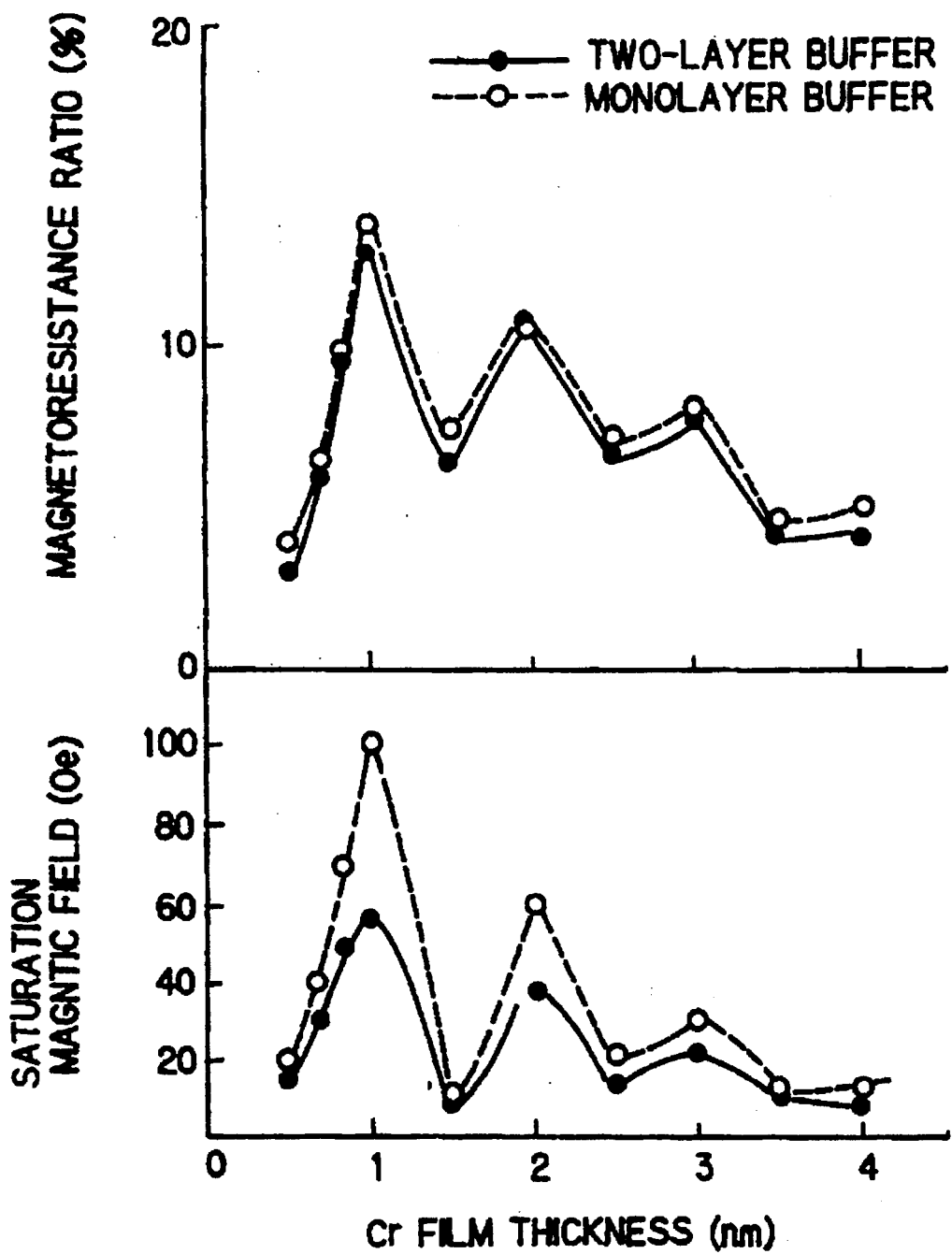
FIG. 11 is a graph showing a Cr-film thickness dependence of magnetoresistance ratio and a saturation magnetic field.

The upper layer of the epitaxial buffer layers is composed of Cr. The magnetoresistance of the epitaxial Fe/Cr superlattice film which is grown on the two-layer structure epitaxial buffer layer as described above is measured at room temperature. Herein, both lower and upper buffer layer-thicknesses are 5 nm. The growth temperature and rate of the lower epitaxial buffer layer are 950° C. and 0.01 nm/s, respectively. The growth temperature and rate of the upper Cr buffer layer are 400° C. and 0.02 nm/s. The Fe/Cr superlattice which has a 3-nm-thick Fe layer and Cr layer of 0.5 to 4 nm in thickness is grown at the substrate temperature of 150° C. and the growth rate of 0.01 nm/s. The magnetoresistance is measured in the same way as in EXAMPLE 11. Meanwhile, as a comparative example, the (110) oriented Fe/Cr superlattice grown on the 10-nm-thick $V_{50}Mo_{50}$ buffer layer in the same growth condition without the Cr epitaxial buffer layer therebetween is referenced. The result obtained is shown in FIG. 11. As seen from FIG. 11, the epitaxial Fe/Cr superlattice which is grown on the two-layered buffer layer which has the lower layer of body-centered cubic crystalline alloy $V_{50}Mo_{50}$ and the upper Cr layer is, as compared with the Fe/Cr superlattice on the monolayer buffer in FIG. 10, is not so different in the magnetoresistance ratio, however, the saturation magnetic field thereof is lowered due to the two-layer buffer structure.

As described above, the magnetoresistive thin-film according to the invention can be provided with a uniform nucleation at the initial stage of growth and the formation of the staircase facets whose shapes are sufficiently controlled, because the (110) oriented Fe/Cr superlattice film is grown on the (110) oriented epitaxial buffer layer which has a high-quality and flat surface. Due to the structural magnetic anisotropy caused by the structure of the staircase facet, it can lower the saturation magnetic field of magnetoresistance while maintaining the large magnetoresistance ratio when a magnetic field is applied to the direction of the ridge line of the facet. Thus, the magnetoresistive thin-film according to the invention can be used for a magnetic sensor or a thin-film magnetic head. Also, it can be provided with an oxide substrate made of a sapphire or the like which has high chemical and physical stabilities and also has a high mechanical strength to provide a magnetic sensor or a thin-film magnetic head or the like with a high reliability.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A magnetoresistive thin-film, comprising:

a substrate;

an (110) oriented epitaxial buffer layer which is formed on said substrate, said buffer layer being made of a body-centered cubic crystalline metal or alloy in which a (110) face is epitaxially grown; and a (110) orientation Fe/Cr superlattice film which is formed on said buffer layer, a Fe (110) face and a Cr (110) face of said superlattice film alternately being epitaxially grown;

wherein said superlattice film has a structure in which a plurality of staircase facets which have <100> direction ridge lines and {100} side surfaces stand side by side;

wherein said staircase facets of said superlattice film have <110> direction widths of 5 to 30 nm at a top surface thereof; and wherein a dispersion of said 110 direction widths is within ±50%.

2. A magnetoresistive thin-film, according to claim 1, wherein: said buffer layer is selected from the group consisting of V, Nb or Ta.

3. A magnetoresistive thin-film, according to claim 1, wherein:

said buffer layer comprises two buffer layers;

wherein the lower layer of said two buffer layers is a (110) oriented epitaxial film which is made of a body-centered cubic crystalline metal or alloy in which a (110) face is epitaxially grown, and the upper layer of said two buffer layers is a (110) orientation Cr epitaxial film.

4. A magnetoresistive thin film, according to claim 3, wherein said lower layer of said two buffer layers is selected from the group consisting of V, Nb or Ta.

5. A magnetoresistive device, comprising:

a magnetoresistive thin-film which comprises a substrate, an (110) orientation epitaxial buffer layer which is formed on said substrate, said buffer layer being made of a body-centered cubic crystalline metal or alloy in which a (110) face is epitaxially grown, and a (110) orientation Fe/Cr superlattice film which is formed on said buffer layer, a Fe (110) face and a Cr (110) face of said superlattice film alternately being epitaxially grown, wherein said superlattice film has a structure in which a plurality of staircase facets which have <100> direction ridge lines and {100} side surfaces stand side by side; and means for applying a magnetic field parallel to said ridge lines of said staircase facets to said magnetoresistive thin-film;

wherein said staircase facets of said superlattice film have <110> direction widths of 5 to 30 nm at a top surface thereof; and wherein a dispersion of said <110> direction widths is within ±50%.

6. A magnetoresistive device, according to claim 5, wherein: said buffer layer is selected from the group consisting of V, Nb or Ta.

7. A magnetoresistive device, according to claim 5, wherein:

said buffer layer comprises two buffer layers;

wherein the lower layer of said two buffer layers is a (110) oriented epitaxial film which is made of a body-centered cubic crystalline metal or alloy in which a (110) face is epitaxially grown, and the upper layer of said two buffer layers is a (110) orientation Cr epitaxial film.

8. A magnetoresistive device, according to claim 7, wherein: said lower layer of said two buffer layers is selected from the group consisting of V, Nb or Ta.

* * * * *

UNITED STATES PATENT AND TRADEMARK OFFICE
CERTIFICATE OF CORRECTION

PATENT NO. : 5,589,278
DATED : December 31, 1996
INVENTOR(S) : Atsushi KAMIJO

It is certified that error appears in the above-indentified patent and that said Letters Patent is hereby corrected as shown below:

On the title page, item [30],
        change " 6-1583188 " to -- 6-153188 --

Signed and Sealed this

Twenty-second Day of July, 1997

Attest:

BRUCE LEHMAN

Attesting Officer     Commissioner of Patents and Trademarks